US006691145B1

(12) United States Patent
Shibata et al.

(10) Patent No.: US 6,691,145 B1
(45) Date of Patent: Feb. 10, 2004

(54) COMPUTING CIRCUIT, COMPUTING APPARATUS, AND SEMICONDUCTOR COMPUTING CIRCUIT

(75) Inventors: Tadashi Shibata, Tokyo (JP); Masahiro Konda, Sendai (JP); Tadahiro Ohmi, Sendai (JP)

(73) Assignee: Semiconductor Technology Academic Research Center, Tokyo (JP)

( * ) Notice: Subject to any disclaimer, the term of this patent is extended or adjusted under 35 U.S.C. 154(b) by 589 days.

(21) Appl. No.: 09/615,754

(22) Filed: Jul. 13, 2000

(30) Foreign Application Priority Data

Aug. 9, 1999 (JP) .......................... 11-225592

(51) Int. Cl.⁷ ............................ G06G 7/00; G06F 7/00; G06F 7/50
(52) U.S. Cl. ...................... 708/801; 708/671; 708/201
(58) Field of Search ...................... 708/801, 3, 201, 708/671; 340/146.2

(56) References Cited

U.S. PATENT DOCUMENTS

| 3,800,164 A | * | 3/1974 | Miller | ................ 340/146.2 |
| 5,162,912 A | | 11/1992 | Ueno et al. | |
| 5,258,657 A | | 11/1993 | Shibata et al. | |
| 5,339,106 A | | 8/1994 | Ueno et al. | |
| 5,521,858 A | | 5/1996 | Shibata et al. | |
| 5,530,393 A | | 6/1996 | Guerrieri et al. | |
| 5,917,732 A | * | 6/1999 | Kawakami et al. | ......... 708/801 |
| 5,923,205 A | | 7/1999 | Shibata et al. | |
| 5,957,996 A | * | 9/1999 | Shiraishi | ................ 708/201 |

FOREIGN PATENT DOCUMENTS

| JP | 3-6679 | 1/1991 |
| JP | 6-53431 | 2/1994 |
| JP | WO96/30853 | 10/1996 |

OTHER PUBLICATIONS

M. Neal, "Absolute–value differencer," Electronics World and Wireless World, vol. 97, No. 1663, May 1, 1991, p. 421.
L Der et al., "A Switched–Capacitor Differencing Circuit with Common–Mode Rejection for Fully Differential Comparators,"IEEE, vol. Symp. 36, pp. 911–914.

* cited by examiner

Primary Examiner—Tan V. Mai
(74) Attorney, Agent, or Firm—Finnegan, Henderson, Farabow, Garrett & Dunner, L.L.P.

(57) ABSTRACT

A computing circuit capable of computing an absolute difference with high-speed analog computation, a computing apparatus capable of computing the sum of absolute differences and a semiconductor computing circuit achievable with simple circuitry and suitable for use in such a computing circuit or apparatus. The computing circuit capable of computing the absolute difference includes a large input selection circuit 1 which outputs either a first signal or a second signal whichever is larger, a small input selection circuit 2 which outputs either the first and second signals whichever signal is smaller, and a subtraction circuit 3 which subtracts the output of the small input selection circuit 2 from the output of the large input selection circuit 1. The subtraction circuit 3 includes a capacitor 6, a first switch 4 provided between a first terminal of the capacitor 6 and the output of the large input selection circuit 1, a second switch 5 provided between the first terminal of the capacitor 6 and the output of the small input selection circuit 2, and a third switch 7 provided between a second terminal of the capacitor 6 and a terminal connected to a prescribed potential. The computing apparatus capable of computing the sum of absolute differences includes a plurality of such computing circuits, and computes the sum of the outputs of the computing circuits by using a summing circuit.

12 Claims, 9 Drawing Sheets

| a | b | c | d | — B |
|---|---|---|---|---|
| e | f | g | h | |
| i | j | k | l | |
| m | n | o | p | |

| A1 | B1 | C1 | D1 |
|----|----|----|----|
| E1 | F1 | G1 | H1 |
| I1 | J1 | K1 | L1 |
| M1 | N1 | O1 | P1 |

Ci — 30

| Ai | Bi | Ci | Di |
|----|----|----|----|
| Ei | Fi | Gi | Hi |
| Ii | Ji | Ki | Li |
| Mi | Ni | Oi | Pi |

| An | Bn | Cn | Dn |
|----|----|----|----|
| En | Fn | Gn | Hn |
| In | Jn | Kn | Ln |
| Mn | Nn | On | Pn |

Cn

Fig.7C $$\text{DISTANCE} = |Ai - a| + |Bi - b| + \cdots + |Pi - p|$$

COMPUTING CIRCUIT, COMPUTING APPARATUS, AND SEMICONDUCTOR COMPUTING CIRCUIT

BACKGROUND OF THE INVENTION

The present invention relates to a computing circuit for performing computations on analog signals, a computing apparatus using the same, and a semiconductor computing circuit suitable for use therein, and more particularly to a computing circuit for computing an absolute difference between two analog signals, and a computing apparatus for computing a Manhattan distance which is a measure of a similarity to a reference pattern.

With the advance of computer technology, dramatic strides have been made in data processing technology in recent years. However, if flexible information processing, such as visual recognition or voice recognition as is done by humans, is to be implemented using a computer, it is said that, with today's digital computers, it is almost impossible to provide computation results in real time. One reason for this is that much of the information we handle in our daily lives is in the form of analog quantities and, when these quantities are represented by digital data, not only does the amount of data become prohibitively large but also the data is inaccurate and ambiguous. It can be said that the problem of today's information processing systems lies in the fact that such extremely redundant analog data are all converted to digital quantities and rigorous digital computations are performed one by one. Furthermore, in today's information processing systems, the computing circuit for performing digital computations and the memory for holding digital data are provided as separate elements, and as a result, a very long computation time is required because of the bus bottleneck between the computing circuit and the memory.

To solve such problems, attempts are being made to achieve information processing more analogous to the human brain by taking in information from the external world in its original form, i.e., in the form of analog quantities, and by performing computations directly on the analog quantities. One such approach to information processing involves evaluating the similarity between an input signal pattern and a prestored analog pattern. More specifically, a large number of voice or image code patterns are stored in advance and, by comparing the input signal pattern with each code pattern for similarity, a code pattern having the highest similarity is extracted. Similarity is measured using the Euclidean distance or the Manhattan distance (the sum of absolute differences); since the computation of the Manhattan distance can be accomplished by calculating only differences whereas the computation of the Euclidean distance requires a multiplication as well and, since, in such processing, evaluating the degree of correlation is of major concern and mathematically rigorous computations are not required, it is common to measure similarity using the Manhattan distance. The semiconductor computing circuit of the present invention lends itself to computation of the Manhattan distance.

Various methods have been proposed for performing computations directly on analog quantities. For example, Japanese Unexamined Patent Publication No. 3-6679 discloses a neuron MOS transistor which behaves like a neuron, a nerve cell, and performs summation of a plurality of analog input signals. Japanese Unexamined Patent Publication No. 6-53431 discloses a computing circuit utilizing this neuron MOS transistor. Further, Republished Patent No. WO96/30853 discloses a semiconductor computing circuit which uses two MOS transistors having a floating gate, with their sources or drains connected together, and which, by applying two analog signals and their difference signal to control gates, computes an absolute-value voltage representing the difference between the two analog signals.

When computing the Manhattan distance, usually the code pattern is predetermined and the similarity between the input signal and the predetermined code pattern is evaluated; once the code pattern is set in the computing circuit, it is desirable that the computation be performed continuously on various image input signals, and it is rare that the code pattern is changed. However, the computing circuit disclosed in the above cited Republished Patent No. WO96/30853 requires that two analog signals or their processed signals be input for each computation. To meet this requirement, a memory for holding code patterns must be provided, and signals read from the memory must be set in each computing cell of the computing circuit each time the computation is performed; this not only increases the computation time but also presents the problem that the wiring for delivering the signals read from the memory to the respective computing cells of the computing circuit becomes enormous. Moreover, if the code pattern is stored in digital signal form, a D/A converter for converting it into an analog signal must be provided, which causes the problem that the amount of circuitry increases.

Further, when performing the computation, it is desirable that input signals be able to be input directly without having to perform computations on them.

SUMMARY OF THE INVENTION

The present invention has been devised to solve the above problems, and an object of the invention is to provide a computing circuit capable of computing an absolute difference with high-speed analog computation, a computing apparatus capable of computing the sum of absolute differences, and a semiconductor computing circuit achievable with simple circuitry and suitable for use in such a computing circuit or apparatus.

FIGS. 1 to 5 are diagrams showing the basic configuration of the computing circuit and computing apparatus of the present invention. To achieve the above object, the computing circuit for computing the absolute difference between a first signal St and a second signal Si, according to the present invention, compares the first and second signals, distinguishes between the larger one and the smaller one, and computes the absolute difference by subtracting the smaller one from the larger one.

Figure 1:
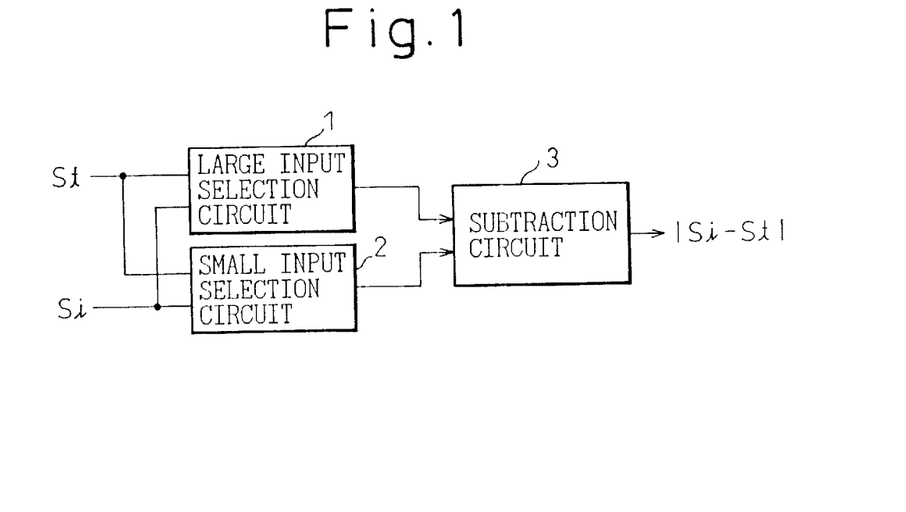
FIG. 1 is a diagram showing the basic configuration of a computing circuit according to the present invention.

More specifically, the computing circuit of the present invention is a computing circuit for computing the absolute difference between the first signal St and the second signal Si, and comprises a large input selection circuit 1 which outputs either the first signal or the second signal whichever is larger, a small input selection circuit 2 which compares the first and second signals and outputs whichever signal is smaller in signal value, and a subtraction circuit 3 which subtracts the output of the small input section circuit 2 from the output of the large input selection circuit 1.

Figure 2:
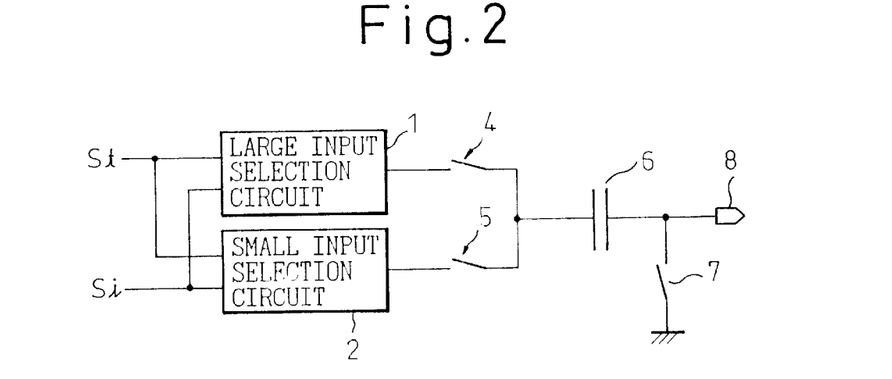
FIG. 2 is a diagram depicting a subtraction circuit in concrete form in the basic configuration of FIG. 1.

As shown in FIG. 2, the subtraction circuit 3 comprises, for example, a capacitor 6, a first switch 4 provided between a first terminal of the capacitor 6 and the output of the large input selection circuit 1, a second switch 5 provided between the first terminal of the capacitor 6 and the output of the small input selection circuit 2, and a third switch 7 provided between a second terminal of the capacitor 6 and a terminal connected to a prescribed potential. After turning the first switch 4 off and the third switch 7 on, when the second switch 5 is turned on the capacitor 6 is charged to the smaller signal level. After that, when the third switch 7 is turned off, and the second switch 5 is also turned off, the charged condition is maintained. Then, when the first switch 4 is turned on, the voltage at the first terminal changes from the smaller one to the larger one, and the potential of the second terminal increases by the amount of the change. In other words, the potential of the second terminal rises from the prescribed potential by an amount equal to the larger one minus the smaller one, i.e., the absolute difference between them. The computation of the absolute difference between the first signal and the second signal is thus accomplished.

Figure 3:
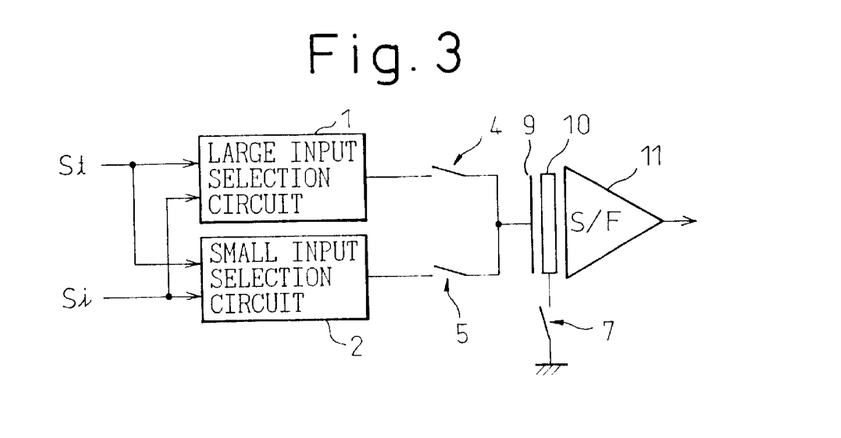
FIG. 3 is a diagram depicting the subtraction circuit in a further concrete form in the configuration of FIG. 2.

Further, as shown in FIG. 3, if the second terminal of the capacitor is made a floating gate 10, and the floating gate is a gate of a source follower circuit 11, then the result of the computation is output from the source follower circuit.

The large input selection circuit can be implemented, for example, by a parallel connection of two NMOS transistors, and the small input selection circuit by a series connection of two NMOS transistors. Then, in the large input selection circuit, by applying the first signal to the gate of one NMOS transistor and the second signal to the gate of the other NMOS transistor, the first signal or the second signal, whichever is larger, is output from the common source electrode. In the small input selection circuit, on the other hand, by applying the first signal to the gate of one NMOS transistor and the second signal to the gate of the other NMOS transistor, the first signal or the second signal, whichever is smaller, is output from the source electrode.

Further, the gates of the NMOS transistors to which the first signal is applied in the large input selection circuit and small input selection circuit are configured as a floating gate common to both NMOS transistors, and a write circuit for writing a voltage to the floating gate is provided. With this configuration, since the first signal once stored is retained semipermanently, and the absolute difference can be computed by just applying the second signal, the computing circuit is suitable for vector quantization or the like.

Alternatively, the large input selection circuit can be implemented by a parallel connection of PMOS transistors, and the small input selection circuit by a series connection of PMOS transistors. In this case also, it is desirable that the gates of the PMOS transistors to which the first signal is applied in the large input selection circuit and small input selection circuit be configured as a floating gate common to both PMOS transistors.

Figure 4:
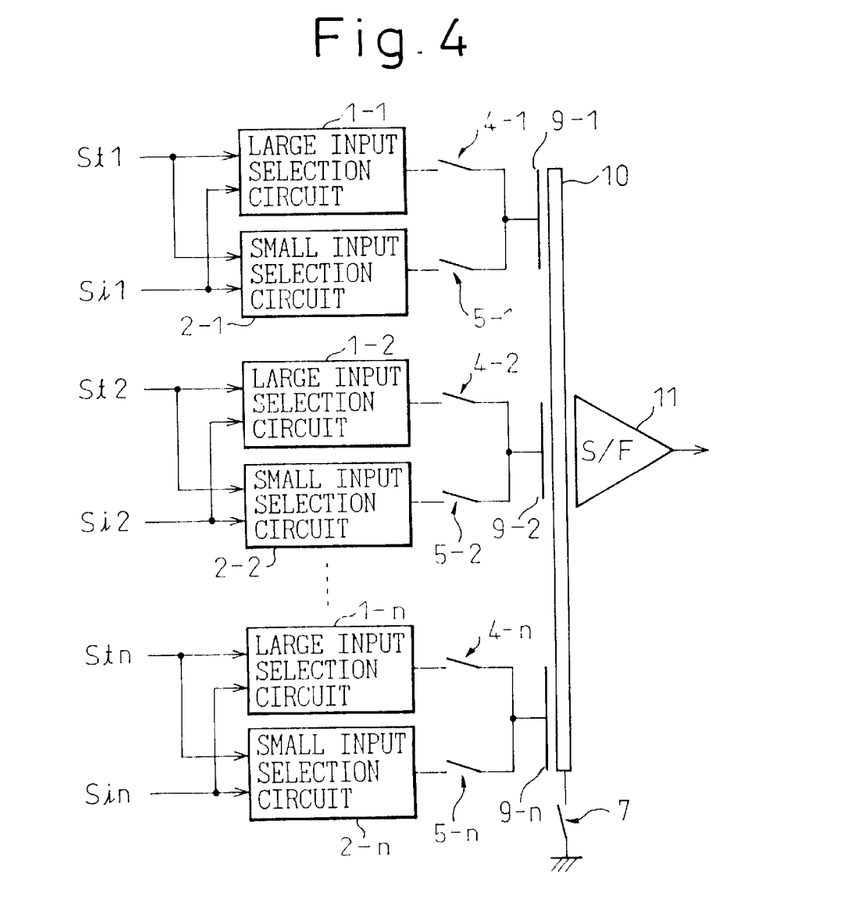
FIG. 4 is a diagram showing the basic configuration of a computing apparatus which uses the computing circuit of FIG. 3 for the computation of the Manhattan distance.

As shown in FIG. 4, the computing apparatus for computing the Manhattan distance, i.e., the sum of the absolute differences between corresponding signals in a first group of signals St1, St2, . . . , Stn and a second group of signals Si1, Si2, . . . , Sin, each group consisting of a predetermined number of signals, comprises a plurality of computing circuits each identical with the above-described computing circuit for computing the absolute difference between the first and second signals, wherein the absolute difference between the corresponding signals in the first signal group and the second signal group, each group consisting of the predetermined number of signals, is computed by each computing circuit, and the sum of the outputs of the plurality of computing circuits is computed by a summing circuit to obtain the Manhattan distance (the sum of the absolute differences). When each computing circuit is constructed with a capacitor and switches, the summing circuit can be realized by connecting together the second electrodes of the respective capacitors. In this case also, it is desirable that the second terminals be configured together as a common floating gate 10, and if the floating gate is made to serve as a gate of a source follower circuit 11, the source follower circuit outputs the sum of the absolute differences between the first signal group and the second signal group.

Figure 5:
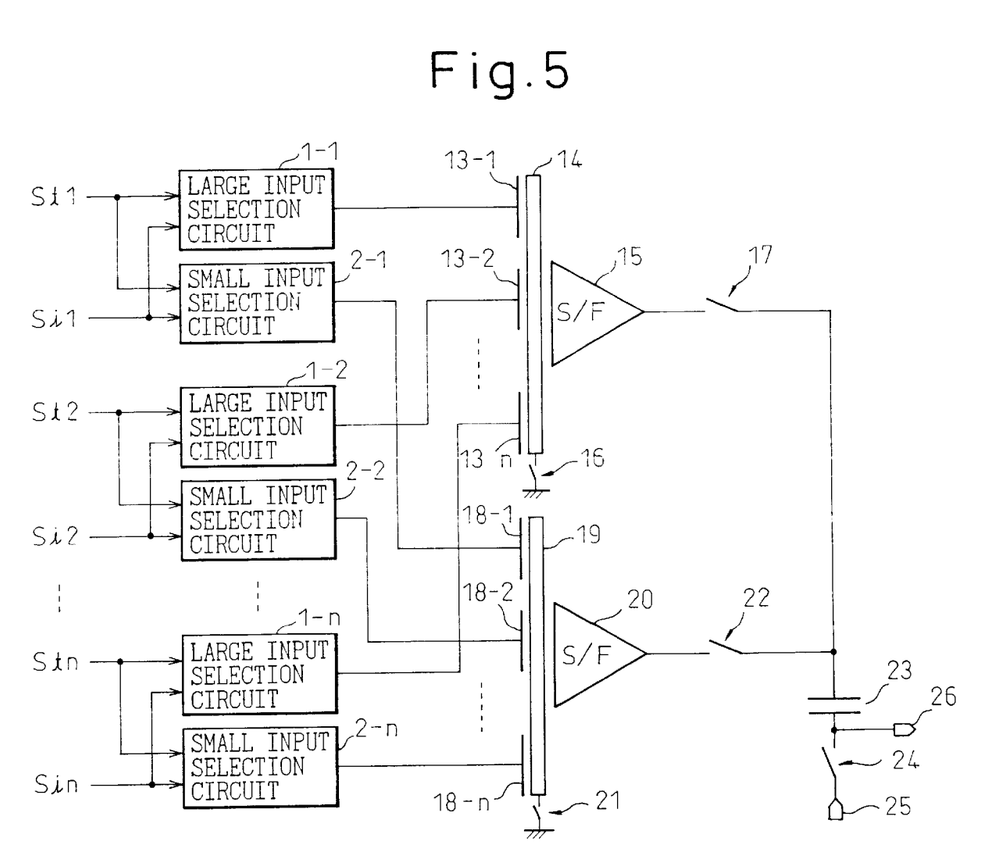
FIG. 5 is a diagram showing the basic configuration of a computing apparatus for computing the Manhattan distance according to another aspect of the present invention.

Further, as shown in FIG. 5, the computing apparatus for computing the Manhattan distance, according to another aspect of the invention, is a computing circuit for computing the sum of the absolute differences between corresponding signals in a first group of signals St1, St2, . . . , Stn and a second group of signals Si1, Si2, . . . , Sin, each group consisting of a predetermined number of signals, and comprises: selection circuits corresponding in number to the predetermined number of signals, each selection circuit including a large input selection circuit, 1-1, 1-2, . . . , 1-n, for comparing the first and second signals and for outputting whichever signal is larger in signal value, and a small input selection circuit, 2-1, 2-2, . . . , 2-n, for comparing the first and second signals and for outputting whichever signal is smaller in signal value; a large summing circuit for summing the outputs of the large input selection circuits in the respective selection circuits; a small summing circuit for summing the outputs of the small input selection circuits in the respective selection circuits; and a subtraction circuit for subtracting the output of the small summing circuit from the output of the large summing circuit.

For example, the large summing circuit comprises first capacitors corresponding in number to the predetermined number of selection circuits and having first terminals 13-1, 13-2, . . . , 13-n connected to the respective outputs of the large input selection circuits in the predetermined number of selection circuits and second terminals connected together as a common second terminal 14, a switch 16 provided between the common second terminal and a terminal connected to a prescribed potential, and a first output circuit 15 for outputting a potential level of the common second terminal; likewise, the small summing circuit comprises second capacitors corresponding in number to the predetermined number of selection circuits and having first terminals 18-1, 18-2, . . . , 18-n connected to the respective outputs of the small input selection circuits in the predetermined number of selection circuits and second terminals connected together as a common second terminal 19, a switch 21 provided between the common second terminal of the second capacitors and a terminal connected to a prescribed potential, and a second output circuit 20 for outputting a potential level of the common second terminal of the second capacitors. On the other hand, the subtraction circuit comprises a capacitor 23, a first switch 17 provided between a first terminal of the capacitor and the output of the first output circuit, a second switch 22 provided between the first terminal of the capacitor and the output of the second output circuit; and a third switch 24 provided between a second terminal of the capacitor and a terminal connected to a prescribed potential, wherein the sum of the absolute differences between the corresponding signals in the first signal group and the second signal group is output from the second terminal of the capacitor by first turning the first switch off and the third switch on, then turning the second switch on, and thereafter turning the third switch off, then turning the second switch off, and finally turning the first switch on.

The invention also provides a semiconductor computing circuit which compares a first signal and a second signal and outputs whichever signal is larger in signal value and whichever signal is smaller in signal value; the semiconductor computing circuit comprises first and second NMOS transistors connected in parallel and third and fourth NMOS transistors connected in series, wherein the first and third NMOS transistors share a common floating gate and, by applying the second signal to the gates of the second and fourth NMOS transistors after writing the first signal to the floating gate, the first signal or the second signal, whichever is larger, is output from a source electrode connected in common to the first and second NMOS transistors, while the first signal or the second signal, whichever is smaller, is output from a source electrode of the third and fourth NMOS transistors.

It is also possible to construct the above semiconductor computing circuit using PMOS transistors. In that case, the two PMOS transistors connected in parallel output the smaller signal, and the two PMOS transistors connected in series output the larger signal.

According to the semiconductor computing circuit of the invention, once the first signal is written to the floating gate, the larger signal and the smaller signal are output respectively, without having to rewrite the first signal, by just applying the second signal directly to the gates of the designated transistors. Accordingly, when this semiconductor computing circuit is applied for use in the computing circuit for computing the absolute difference between the two signals or the computing apparatus for computing the Manhattan distance, there is no need to provide a separate memory for storing the signals of the first signal group corresponding to code patterns, and the signal path from the memory to the gate of each semiconductor computing circuit can be eliminated. As a result, a computing circuit and computing apparatus simple in circuitry and capable of high-speed computation can be achieved.

Furthermore, once the first signal is written to the floating gate of the semiconductor computing circuit, there is no need to apply the first signal voltage when performing the computation; accordingly, the write circuit for writing to the floating gate of the semiconductor computing circuit may be made removable so that the write circuit can be removed from the computing circuit after writing to the floating gate using the write circuit.

BRIEF DESCRIPTION OF THE DRAWINGS

The feature and advantages of the invention will be more clearly understood from the following description taken in conjunction with the accompanying drawings in which.

DESCRIPTION OF THE PREFERRED EMBODIMENTS

A description will be given below of an embodiment of the present invention as applied to a semiconductor computing circuit forming part of a computing apparatus employed in a vector quantization image compression apparatus.

Figure 6:
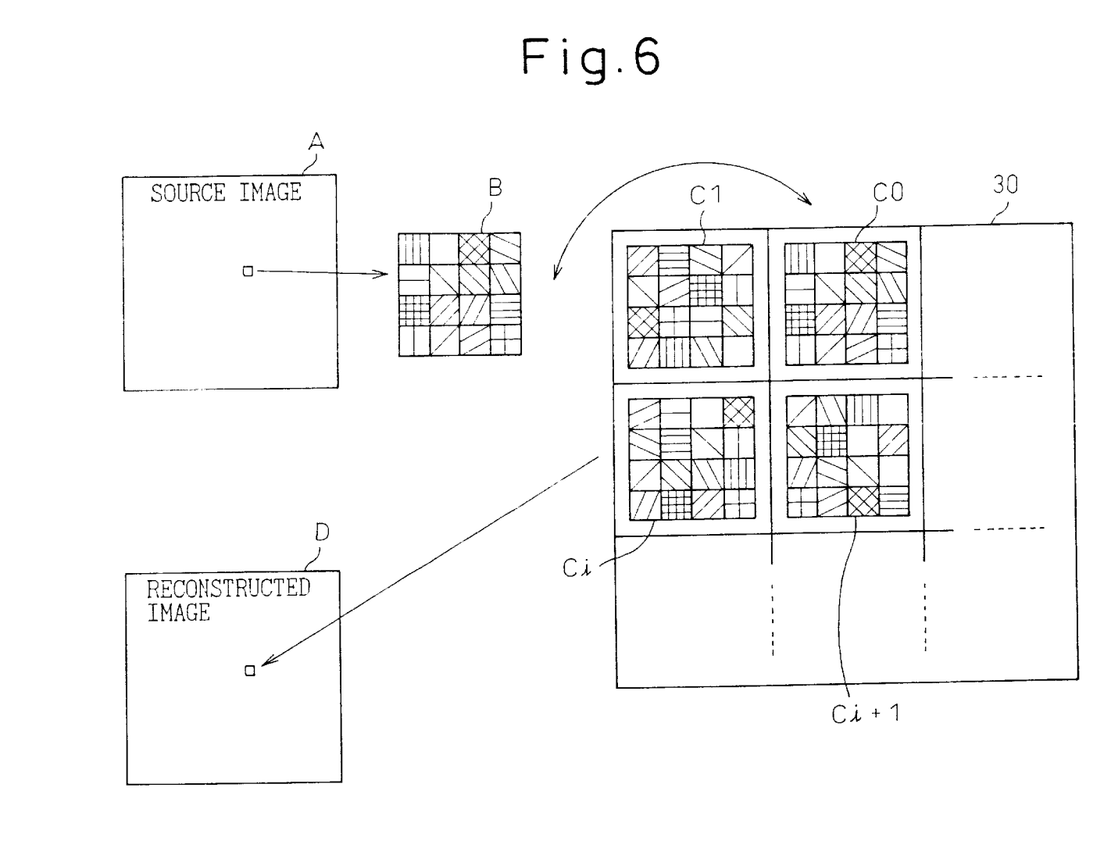
FIG. 6 is a diagram for explaining an image compression process by vector quantization performed in a computing apparatus according to an embodiment of the present invention.

FIG. 6 is a diagram for explaining the technique of vector quantization employed in the embodiment of the invention. In FIG. 6, it is assumed that source image A is image data having, for example, 256 grayscale levels with each pixel represented by 8 bits. Here, if a block of 4×4 pixels, i.e., 16 pixels, is taken as one unit, for example, the data amount per unit is 128 bits. The number of patterns that one unit can take is then $2^{128}$. Of these possible patterns, 2048 patterns C1, C2, . . . , Ci, . . . are defined and stored in a code book 30. Eleven bits are needed to define the 2048 patterns. The source image A is segmented into a plurality of units B of 4×4 pixels; then, the set of 2048 patterns stored in the code book 30 is searched to locate a pattern that most closely resembles the unit B under consideration, and the pattern code is assigned to the unit and stored. This process is repeated for each unit. When reconstructing the image, the code corresponding to each unit is read from the code book 30 and assigned to the corresponding unit. In this case, a data amount reduction from 128 bits to 11 bits is achieved.

Figure 7A:
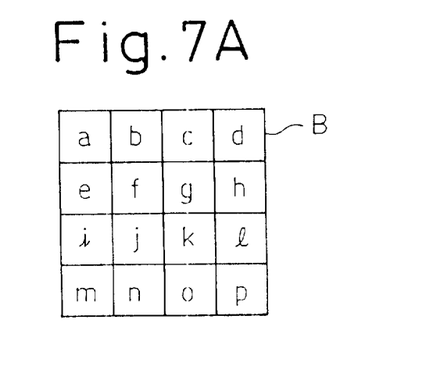
FIGS. 7A to 7C are diagrams for explaining the computation of the Manhattan distance in the image compression process by vector quantization.
Figure 7B:
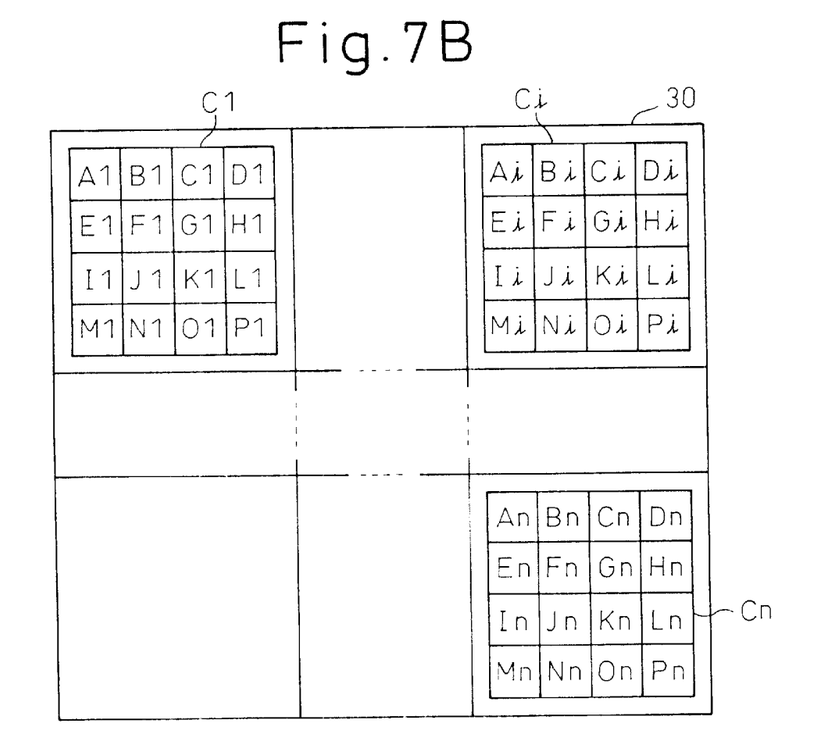
Figure 7C:
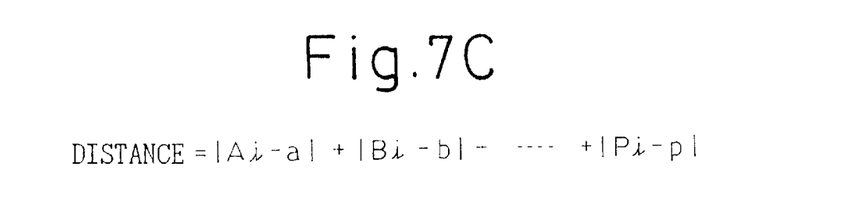

FIGS. 7A to 7C are diagrams for explaining the process of searching for a pattern that most closely resembles each unit. FIG. 7A shows one unit B segmented from the source image A. The unit B consists of 16 pixels whose grayscale data are denoted by a to p, respectively. As shown in FIG. 7B, 2048 patterns C1, . . . , Ci, . . . , Cn are stored in the code book 30, and the pixels in each pattern have grayscale data denoted by A1 to P1 in the case of the pattern C1 and by An to Pn in the case of the pattern Cn. Here, the pattern that minimizes the sum of the absolute differences in grayscale data between the corresponding pixels, i.e., the Manhattan distance shown in FIG. 7C, is judged to be the closest one. The computing apparatus according to the embodiment of the present invention utilizes analog processing to compute the Manhattan distance and determine the pattern that has the smallest distance. The grayscale data of the pixels in each pattern stored in the code book 30 is called template data, though they are analog signals.

Figure 8:
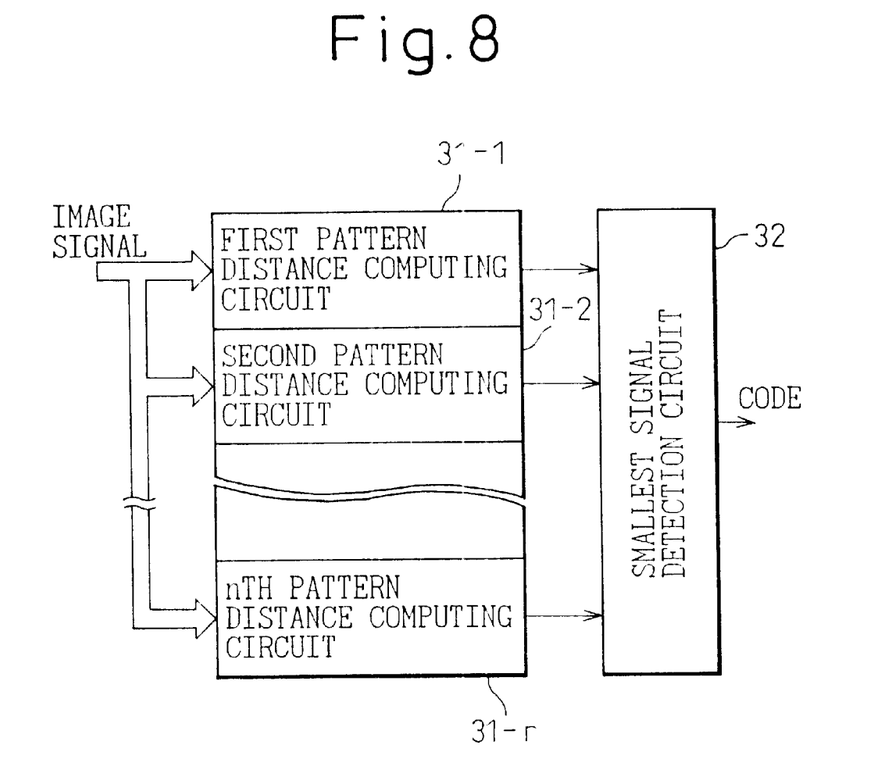
FIG. 8 is a block diagram showing the configuration of the computing apparatus for performing the image compression by vector quantization according to the embodiment of the present invention.

FIG. 8 is a block diagram showing the configuration of the computing apparatus according to the embodiment of the present invention. As shown, the computing apparatus comprises a number, n, of pattern distance computing circuits, i.e., the first to nth pattern distance computing circuits 31-1 to 31-n, and a smallest signal detection circuit 32 which detects the smallest distance from among the distances computed by the first to nth pattern distance computing circuits 31-1 to 31-n and outputs a code indicating the pattern having the smallest distance. The computing apparatus thus outputs the code representing the pattern that most closely matches the image signal. Here, n represents the number of patterns stored in the code book 30; in the example described with reference to FIGS. 6 and 7A to 7C, n is 2048.

The image signal consists of analog signals representing the values of the pixels a to p in each unit when the source image A, as shown in FIG. 6, is segmented into a plurality of units each consisting of 4×4 pixels as shown in FIG. 7A. More specifically, the image signal consists of 16 analog signals which are output in parallel; these signals are either output in parallel using a special TV camera, or generated by reading 16 pieces of data in parallel from a bit map memory where the image data is stored and by converting them into analog form.

The first to nth pattern distance computing circuits 31-1 to 31-n are identical circuits; in operation, the absolute difference between the analog value of each pixel in the image signal and the value of the corresponding template data is calculated, the Manhattan distance between the image signal and each pattern is computed by summing the absolute differences for all (16) pixels, and an analog signal having a strength proportional to the Manhattan distance is output. From among the analog signals representing the Manhattan distance and output from the first to nth pattern distance computing circuits 31-1 to 31-n, the smallest signal detection circuit 32 detects the signal of the smallest strength and outputs the code indicating the pattern having the smallest Manhattan distance, i.e., the pattern that most closely matches the image signal. The smallest signal detection circuit 32 can be constructed using, for example, a winner-take-all circuit, similar to the one described in the previously cited Japanese Unexamined Patent Publication No. 6-53431, that detects the smallest input and outputs a signal indicating that input. A detailed description of this circuit will not be given here.

Figure 9:
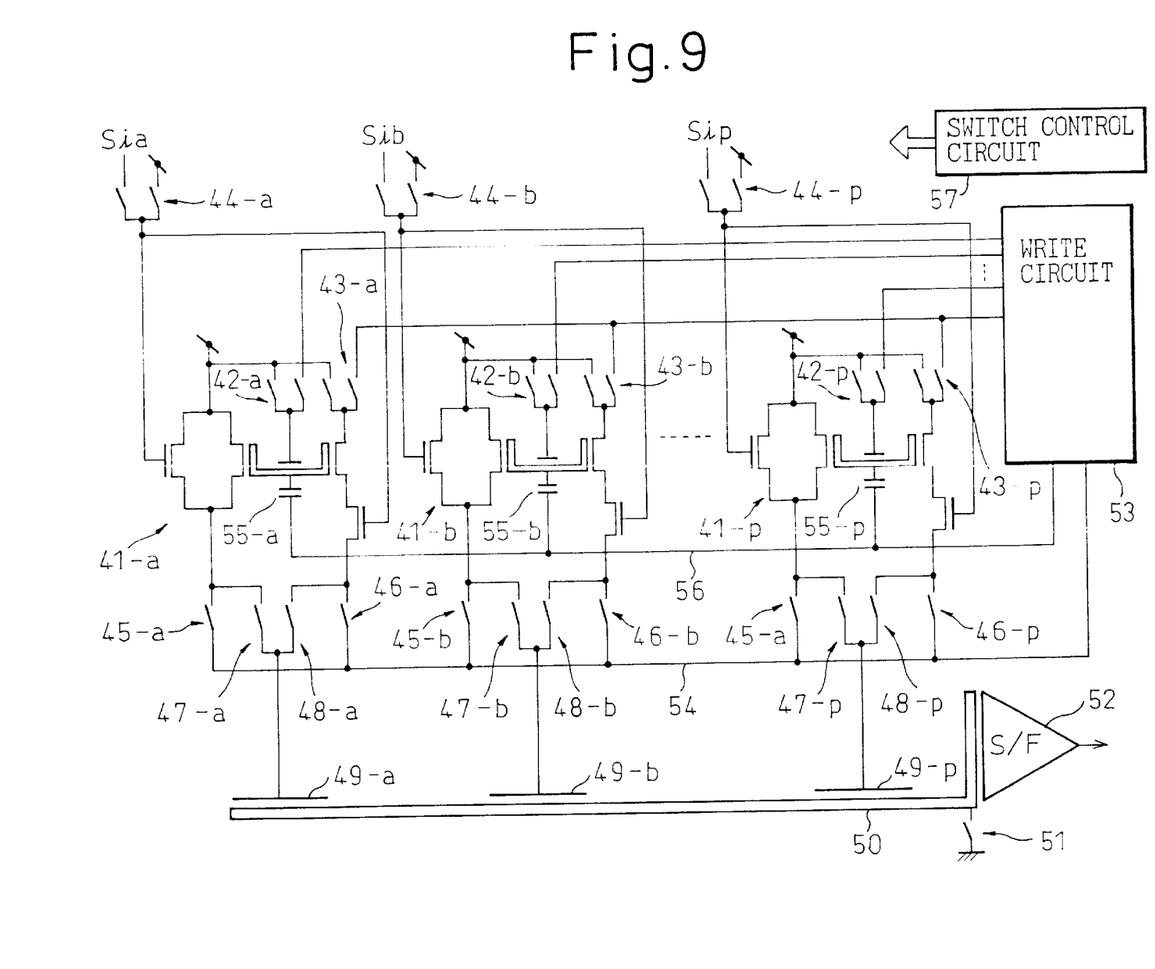
FIG. 9 is a diagram showing the configuration of a pattern distance computing circuit in the computing apparatus of the embodiment.

FIG. 9 is a diagram showing the configuration of one of the first to nth pattern distance computing circuits 31-1 to 31-n. As shown, the pattern distance computing circuit comprises: 16 computing cells 41-a to 41-p; switches 42-a to 42-p, each for switching the signal to be applied to a control gate capacitively coupled to a floating gate of two N-channel MOS transistors in each computing cell; switches 43-a to 43-p, each for switching the signal to be applied to a drain of series connected N-channel MOS transistors in each computing cell; switches 44-a to 44-p, each for switching the signal to be applied to the gates of two N-channel MOS transistors in each computing cell between the supply voltage $V_{DD}$ and the corresponding one of the pixel signals Sia to Sip of the image signal; switches 45-a to 45-p, each for switching the output of parallel connected N-channel MOS transistors in each of the computing cells 41-a to 41-n for connection to or disconnection from a signal line 54; switches 46-a to 46-p, each for switching the output of the series connected N-channel MOS transistors in each of the computing cells 41-a to 41-n for connection to or disconnection from the signal line 54; switches 47-a to 47-p, each for switching the output of the parallel connected N-channel MOS transistors in each of the computing cells 41-a to 41-n for connection to or disconnection from a subtraction circuit; switches 48-a to 48-p, each for switching the output of the series connected N-channel MOS transistors in each of the computing cells 41-a to 41-n for connection to or disconnection from the subtraction circuit; write circuits 55-a to 55-p for writing to the floating gates of the respective computing cells 41-a to 41-n; the subtraction circuit; a write circuit 53 for outputting signals, during the write operation, to be supplied onto the signal line 54, the signal line 56 connected to the write circuits 55-a to 55-n, and the switches 42-a to 42-p and 43-a to 43-p; and a switch control circuit 57 for controlling the state of each switch. The subtraction circuit comprises: first electrodes 49-a to 49-p connected to the respective switch pairs of the switches 47-a to 47-p and 48-a to 48-p; a common floating gate 50; a switch 51 for switching the connection of the common floating gate 50 with respect to a ground potential terminal; and a source follower circuit 52 having the common floating gate 50 as its gate. The first electrodes 49-a to 49-p and the common floating gate 50 form a capacitor. In other words, this capacitor corresponds to 16 capacitors having the electrodes 49-a to 49-p as their respective first electrodes and whose second electrodes are connected together to form the common floating gate. Template data are written to the respective computing cells, and the absolute differences relative to the signals Sa to Sp are computed.

First, the configuration and operation of the computing cell and the write control circuit according to the present embodiment will be described with reference to FIG. 10.

Figure 10:
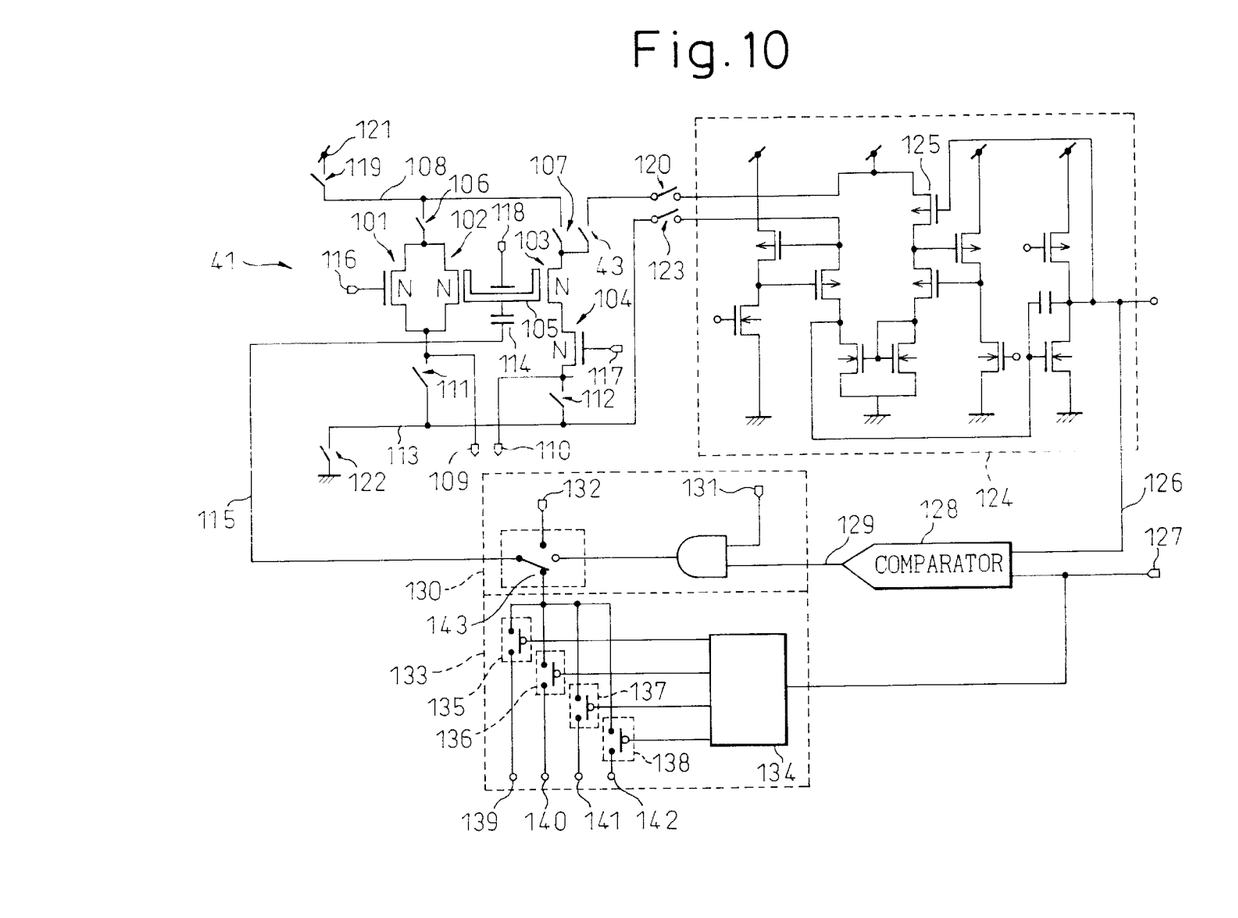
FIG. 10 is a circuit diagram showing the configuration of a computing cell and a write control circuit according to the embodiment.

FIG. 10 is a circuit diagram showing the computing cell 41 and the write circuit 53. Only one computing cell is shown here. A readout circuit 124, a comparator 128, a write voltage control circuit 133, and a write voltage selector circuit 130 together constitute the write control circuit 53.

Reference numerals 101 and 102 indicate the parallel connected NMOS transistors, and 103 and 104 designate the series connected NMOS transistors; the floating gate 105 is shared between the NMOS transistors 102 and 103. The floating gate 105 is formed, for example, from n+ polysilicon, and controls the on/off state of the NMOS transistors 102 and 103. The drains of the parallel connected NMOS transistors 101 and 102 are coupled together and connected to a signal line 108 via a switch device 106 formed from a PMOS transistor. The drain of the series connected NMOS transistor 103 is connected to the signal line 108 via a switch device 107 formed from a PMOS transistor, and also to a designated terminal of the readout circuit 120 via the switch device 43 formed from a PMOS transistor and via a CMOS transmission gate 120. On the other hand, the source electrodes of the parallel connected NMOS transistors 101 and 102 are coupled together, and are connected to a terminal 109, which is connected to the switch 47 in FIG. 9, and also to a signal line 113 via a switch device 111 formed from an NMOS transistor. Further, the source electrodes of the series connected NMOS transistors 103 and 104 are coupled together, and are connected to a terminal 110, which is connected to the switch 48 in FIG. 9, and also to the signal line 113 via a switch device 112 formed from an NMOS transistor. It can therefore be said that the switch devices 111 and 112 correspond to the switches 45 and 46 in FIG. 9 and the signal line 113 to the signal line 54. In the present embodiment, the switch devices 106 and 107 are each formed from a PMOS transistor and the switch devices 111 and 112 are each formed from an NMOS transistor, but it will be appreciated that any device may be used as long as it has the function as a switch device. The gate 116 of the NMOS transistor 101 and the gate 117 of the NMOS transistor 104 are connected to the switch 44 in FIG. 9.

The floating gate 105 is, on one side, capacitively coupled to the control gate 118 and, on the other side, connected to a write circuit 114 which performs charge injection and removal. The write circuit 114 is connected to an output terminal 115 of the write voltage selector circuit 130 as well as to the floating gate 105. Accordingly, the circuit 114 corresponds to the circuit 55 in FIG. 9 and the output terminal 115 corresponds to the signal line 56. The floating gate 105 is connected to the output terminal 115 of the write voltage selector circuit 130 via a thin tunnel oxide film. The write circuit 114 takes a high voltage from the output terminal 115, applies the high voltage between the floating gate 105 and the output terminal 115 (i.e., across the tunnel oxide film), and injects charges into or removes charges from the floating gate 105 utilizing the Fowler-Nordheim current.

Instead of the tunnel oxide film, a nitride film or an oxide/nitride film (ONO film) may be used, and charge injection and removal may be performed utilizing the Frankel-Poole emission current. Alternatively, the circuit 114 may be constructed from a MOS transistor having a floating gate which is connected to the floating gate 105, the source or drain electrode of this transistor being connected to the output terminal 115 of the voltage selector circuit 130 and the other electrode connected to ground potential or a prescribed potential, and charge injection and removal may be performed utilizing the channel-hot-electron current.

In the illustrated example, the signal line 108 is connected to a 5-V power supply line 121 via a switch device 119 formed from a PMOS transistor. On the other hand, the signal line 113 is connected to a 0-V ground line via a switch device 122 formed from an NMOS transistor, and also to a designated terminal of the readout circuit 124 via a switch device 123 formed from a CMOS transmission gate.

As shown, a MOS transistor 125 in the readout circuit 124 is paired with the MOS transistor 103 in the computing cell, and the readout circuit 124, in combination with the MOS transistor 103, reads out the voltage on the floating gate 105 of the MOS transistor utilizing the op amp voltage follower operation, and outputs the readout voltage value onto an output terminal 126. In the illustrated example, the value of the voltage on the floating gate 105 is read out utilizing the op amp voltage follower operation, but the readout circuit may be constructed by connecting the signal line 108 or 113 to the output terminal 126 so as to read out the voltage value utilizing the transistor source follower operation; in this case also, the voltage can be read out without any problem.

The output terminal 126 of the readout circuit 124 and an external input terminal 127 are connected to input terminals of the comparator 128. An output terminal 129 of the comparator 128 is connected to the write voltage selector circuit 130.

The comparator 128 takes as inputs the voltages from the output terminal 126 of the readout circuit 124 and the external input terminal 127, and outputs a termination signal at its output terminal 129 when the voltage on the output terminal 126, read out by the readout circuit 124 at the time of writing to the floating gate 105, becomes equal to the voltage on the external input terminal 127.

The write voltage selector circuit 130 selects either an output terminal 143 of the write voltage control circuit 133 or a terminal 132 at which ground potential or a voltage equal to one-half the voltage of the output terminal 143, for example, is input; more specifically, when control voltages on the terminals 129 and 131 are both "1", the output terminal 143 of the write voltage control circuit 133 is selected for connection to the output terminal 115 of the write voltage selector circuit 130, otherwise the voltage on the terminal 132 is selected for output onto the output terminal 115.

The write voltage control circuit 133 is configured so that the voltage to be output on the output terminal 143 can be varied in steps, and the voltage to be output on the output terminal 143 is varied in accordance with the voltage to be written. For example, the analog voltage applied at the external signal input terminal 127 is converted by a 2-bit A/D converter 134 into digital form, and only one of switch devices 135, 136, 137, and 138 is caused to conduct. If, for example, the target value of the voltage to be written to the floating gate 105 takes a value ranging from 0.5 V to 4.5 V; then, when the voltage value on the external signal input terminal 127 is within a range of 0.5 V to 1.5 V, the switch device 135 is caused to conduct so that an input voltage at a terminal 139 is output on the output terminal 143. Likewise, when the voltage value on the external signal input terminal 127 is within a range of 1.5 V to 2.5 V, the switch device 136 is caused to conduct so that an input voltage at a terminal 140 is output on the output terminal 143. Similarly, when the voltage value on the external signal input terminal 127 is within a range of 2.5 V to 3.5 V, an input voltage at a terminal 141 is selected, and when the voltage value on the external signal input terminal 127 is within a range of 3.5 V to 4.5 V, an input voltage at a terminal 142 is selected for output on the output terminal 143 of the write voltage control circuit 133. In this way, the target value of the voltage to be written to the floating gate 105, that is, the write voltage determined in accordance with a predetermined rule based on the value of the input voltage at the external signal input terminal 127, is output on the output terminal 143 of the write voltage control circuit 133. The circuit shown here is configured to select one of the voltages input at the terminals 139 to 142 in accordance with the voltage input at the external signal input terminal 127; alternatively, the external signal input terminal 127 may be taken as an input to the write voltage control circuit, eliminating the input terminals 140, 141, and 142, and the voltage input from the external signal input terminal 127 may be added to the input voltage at the terminal 139 to output the sum voltage on the output terminal 143. It is also possible to construct the write voltage control circuit from a circuit that has a predefined input/output characteristic relationship between the voltage input from the external signal input terminal 127 and the voltage output at the output terminal 143 such that the output voltage is expressed as a function of the input voltage, for example, the value obtained by adding +15.0 V to the square root of the input voltage from the terminal 127 is equal to the output voltage delivered at the terminal 143.

Though not shown here, each switch device is controlled by the switch control circuit 57.

A detailed operational description will be given below by dividing the operation into two modes, a write mode for writing the template data and a computing mode for performing computation with the input data after writing. First, the write mode will be described. In the write mode, template data is written to the floating gate 105.

In the write mode, the switches 42-a to 42-p and 43-a to 43-p are set so that only the computing cell where writing to the floating gate is performed is connected to the readout circuit 124, and the switches 44-a to 44-p are set so that 5 V is applied only to the computing cell where writing to the floating gate is performed. Further, the switch 111 is turned off, while the switch 112 is turned on. That is, the switches 45-a to 45-p are all turned off while, of the switches 46-a to 46-p, only the one that is connected to the computing cell to be written to is turned on. The switches 47-a to 47-p and 48-a to 48-p are all turned off.

With the above switch control, writing can be done only to the floating gate of the computing cell to be written to, and the voltage on the series connected NMOS transistor 103 in that computing cell becomes ready to be read out by the readout circuit 124. The NMOS transistor 104 is conducting since 5 V is applied to its gate, and the voltage to be read out is determined by the voltage on the NMOS transistor 103.

A voltage of the same value as the voltage to be written to the floating gate 105 is taken as the target voltage and is input at the external signal input terminal 127 of the comparator 128. Here, if the voltage value on the external signal input terminal 127 is 3 V, for example, then only the switch device 137 in the write voltage control circuit 133 is caused to conduct, and the voltage from the terminal 141 is output onto the output terminal 143.

In this condition, the terminal 131 of the write voltage control selector circuit 130 is set to "1"; then, if the voltage on the output terminal 126 of the readout circuit 124 is not identical with the voltage (3 V) on the external signal input terminal 127, the comparator 128 outputs "0" at its output terminal 129, as a result of which the write voltage at the output terminal 143 of the write voltage control circuit 133 is output on the output terminal 115 of the write voltage selector circuit 130, thus starting the write operation to the floating gate 105. During this write operation, the voltage value on the floating gate 105 is constantly read out by the readout circuit 124, and the readout value is output on the output terminal 126. When the voltage on the terminal 126 becomes equal to the voltage value on the external signal input terminal 127, the comparator 128 outputs "1" as a write termination signal at its output terminal 129, causing the output voltage on the terminal 115 to switch from the write voltage at the terminal 143 to the write termination voltage at the terminal 132 and thereby terminating the write operation to the floating gate 105.

After writing to the floating gate 105 of one computing cell 41-a is completed, writing is performed in the same manner to the floating gates of the other 15 computing cells 41-b to 41-p in sequence. In all the pattern distance computing circuits 31-1 to 31-n, writing is performed in accordance with the corresponding pattern template data.

As described above, according to the present embodiment, analog/multi-valued target values can be written using the write voltages determined based on the four kinds of voltage values. Furthermore, according to the present embodiment, since writing to the floating gate to be used for computation is performed using the write voltage determined based on the write target voltage applied to the external signal input terminal 127, the write time from the start to the end of the write operation can be shortened and can be equalized to a certain extent.

In writing the template data, if the writing is performed while reading out by the readout circuit, and the end of the write operation is detected using the readout voltage, there occurs a time delay from the time the voltage on the floating gate reaches the write target value until the time the writing is actually terminated, and any value written during this delay time causes an error. In the present embodiment, by supplying the optimum write voltage based on the write target voltage, the write time is equalized to a certain extent and variations in write speed causing a write error immediately before the end of the write operation are held within a predefined range. This accomplishes high-accuracy writing.

As described above, in the present embodiment, the write voltage is varied in steps according to the write target value in order to increase the write speed and reduce the variations in write speed due to the write target value, but it will be recognized that the write voltage may be maintained constant regardless of the write target voltage.

Furthermore, in the present embodiment, at the same time that the voltage is written to the gate electrode for computing, the voltage value is read out to determine whether or not the voltage has reached the write target value, but this is only one example, and instead, the widely practiced write/verify method can be employed.

In the above example, the voltage written to the floating gate 105 is read out via the NMOS transistor 103, but it is also possible to read it via the NMOS transistor 102.

Since the voltage written to the floating gate 105 is retained semipermanently, there is no need to rewrite the voltage to the floating gate as long as the template data is not changed. Accordingly, the write circuit 53 may be provided in a separate write apparatus; in that case, a device containing circuitry other than the write circuit 53 can be used as the computing apparatus after writing the desired template data to the device by using the write apparatus. The circuit size can then be reduced because the write circuit 53 can be omitted from the device.

Next, the computing mode will be described. It is assumed here that the template data has already been written to each floating gate 105 before entering the computing mode. First, the switches 42-a to 42-p and 43-a to 43-p are set so that the supply voltage 5 V is applied to all the control gates 118 and the drains of the respective NMOS transistors 103. More specifically, referring to FIG. 10, the switches 106, 107, and 119 are turned on, and the switch 43 is turned off. The control gate 118 is also connected to the power supply terminal 121. The switches 44-a to 44-p are set so that the input signals Sia to Sip are supplied. The switches 45-a to 45-p are all turned off, that is, the switches 111 and 112 are turned off. In this state, the input signal Si is applied to the gate of the NMOS transistor 101, and a voltage corresponding to the input signal Si is produced; at the same time, the NMOS transistor 102 outputs the voltage written to the floating gate 105. Since the NMOS transistors 101 and 102 are connected in parallel, the larger voltage is output at their source electrodes. The input signal Si is also applied to the gate of the NMOS transistor 104, and a voltage corresponding to the input signal Si is produced; at the same time, the NMOS transistor 103 outputs the voltage written to the floating gate 105. Since the NMOS transistors 103 and 104 are connected in series, the smaller voltage is output at their source electrodes.

As described above, in each computing cell, the pair of the parallel connected NMOS transistors outputs the voltage (template data) written to the floating gate or the input signal, whichever is larger, while the pair of the series connected NMOS transistors outputs the voltage (template data) written to the floating gate or the input signal, whichever is smaller. The computing operations in the respective computing cells proceed in parallel, and the outputs are produced in parallel and simultaneously from the respective computing cells.

Turning back to FIG. 9, the operation of the subtraction circuit will be described. After turning off the switches 47-a to 47-p and 48-a to 48-p, the switch 51 is turned on to connect the common floating gate 50 to 0 V (ground level). Then, the switches 48-a to 48-p are turned on so that the smaller outputs of the respective computing cells 41-a to 41-p are applied to the respective first electrodes 49-a to 49-p. As a result, a charge corresponding to the sum of the smaller outputs of the respective computing cells 41-a to 41-p is stored on the capacitor. Next, the switch 51 is turned off to put the common floating gate 50 into the floating state. Next, when the switches 47-a to 47-p are turned on after turning off the switches 48-a to 48-p, the sum of the larger outputs of the respective computing cells 41-a to 41-p is applied to the first electrode of the capacitor. That is, the voltage applied to the first electrode changes from the sum of the smaller outputs to the sum of the larger outputs of the respective computing cells 41-a to 41-p. Since the common floating gate 50 is in the floating state, the voltage on the common floating gate 50 increases by the amount of change of the voltage on the first electrode. Since the common floating gate 50 is the gate of the source follower circuit 52, the voltage on the common floating gate 50 is externally read out through the source follower circuit 52. That is, the sum of the absolute differences of the input signals corresponding to the template data written to the floating gates of the respective computing cells is output.

As described above, in the computing mode, each of the pattern distance computing circuits 31-1 to 31-n outputs the Manhattan distance between the template data of the corresponding pattern stored in the code book 30 and the image signal, and the smallest signal detection circuit 32 searches for the pattern having the smallest distance and outputs a code indicating that pattern. In this way, the pattern that most closely resembles the one unit of the image signal is determined.

In the present embodiment, the write control circuit 53 for varying the amount of charge on the floating gate is implemented using the readout circuit, comparator, write voltage control circuit, and write voltage selector circuit, but any other means may be used as long as the means is capable of varying the amount of charge on the floating gate; in that case also, the effect of the present invention can be achieved.

As described above, using a very small number of transistors, the invention achieves an apparatus that functions as a nonvolatile analog/multi-valued memory for storing template data, and that computes the Manhattan distance, i.e., the absolute difference between the stored data (template data) and the input data, and detects the pattern having the smallest distance.

Figure 11:
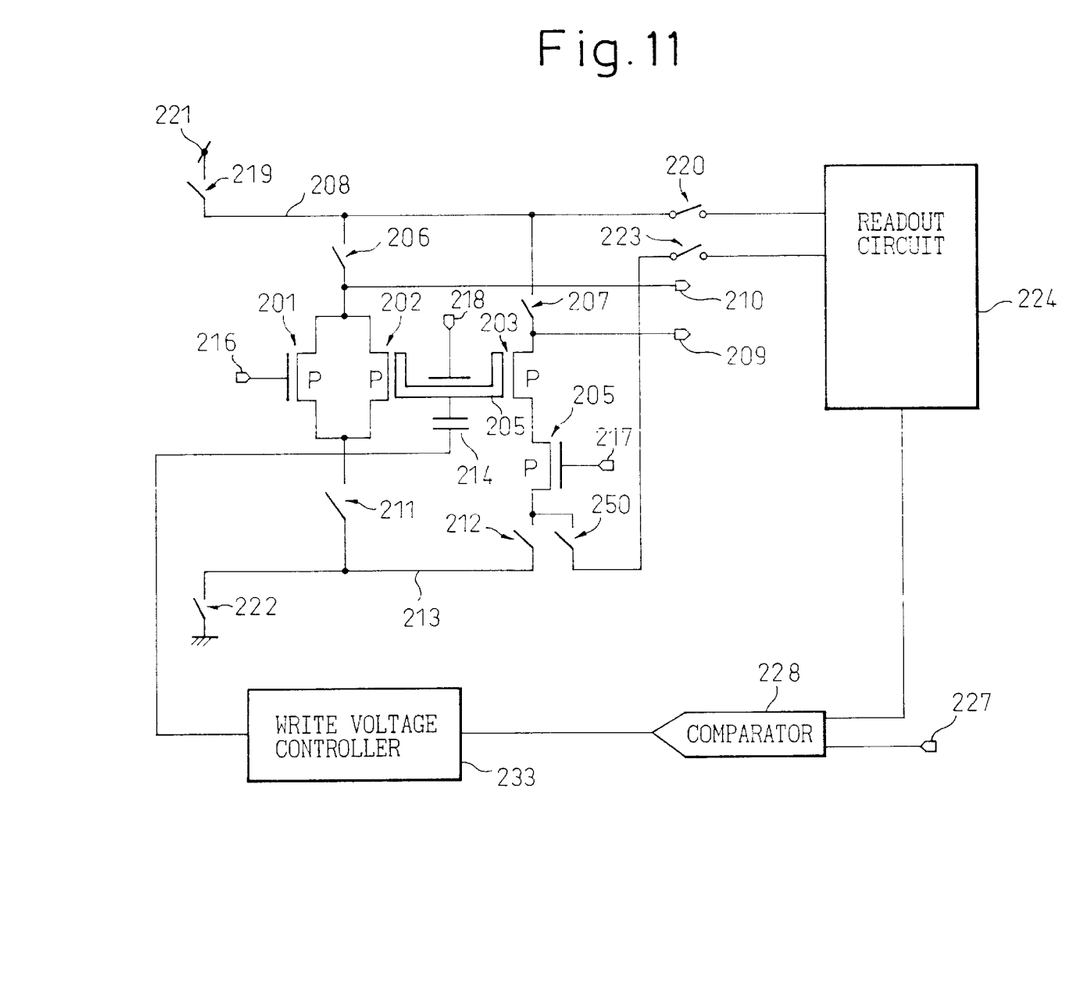
FIG. 11 is a diagram showing an example in which the computing cell is constructed using PMOS transistors.

The above embodiment has dealt with an example in which each computing cell is constructed using NMOS transistors, but it will be appreciated that each computing cell can be constructed using PMOS transistors. FIG. 11 is a diagram showing one such example; as in FIG. 10, one computing cell is shown together with the write control circuit. The operation of this computing cell is the same as that of the cell constructed with NMOS transistors, and a description will not be given here; it should, however, be noted that the smaller voltage is output from the source electrodes of the parallel connected PMOS transistors, while the larger voltage is output from the source electrodes of the series connected PMOS transistors.

As described above, according to the present invention, a computing circuit capable of storing analog or multi-valued data at high speed and high accuracy and capable of performing analog or multi-valued computations with high accuracy can be achieved with simple circuitry.

We claim:

1. A computing circuit for computing an absolute difference between a first signal and a second signal, comprising:
   a large input selection circuit which compares said first and second signals and outputs whichever signal is larger in signal value;
   a small input selection circuit which compares said first and second signals and outputs whichever signal is smaller in signal value; and
   a subtraction circuit for subtracting the output of said small input selection circuit from the output of said large input selection circuit, wherein said subtraction circuit comprises:
   a capacitor;
   a first switch provided between a first terminal of said capacitor and the output of said large input selection circuit;
   a second switch provided between the first terminal of said capacitor and the output of said small input selection circuit; and
   a third switch provided between a second terminal of said capacitor and a terminal connected to a prescribed potential, and wherein:
   the absolute difference between said first signal and said second signal is output from said second terminal of said capacitor by first turning said first switch off and said third switch on, then turning said second switch on, and thereafter turning said third switch off, then turning said second switch off, and finally turning said first switch on.

2. A computing circuit as claimed in claim 1, wherein said second terminal of said capacitor is a floating gate, and wherein said floating gate is a gate of a source follower circuit, and said source follower circuit outputs the absolute difference between said first signal and said second signal.

3. A computing circuit for computing an absolute difference between a first signal and a second signal, comprising:
   a large input selection circuit which compares said first and second signals and outputs whichever signal is larger in signal value;
   a small input selection circuit which compares said first and second signals and outputs whichever signal is smaller in signal value; and
   a subtraction circuit for subtracting the output of said small input selection circuit from the output of said large input selection circuit, wherein
   said large input selection circuit is a circuit comprising two NMOS transistors connected in parallel and, by applying said first signal to a gate of one of said NMOS transistors and said second signal to a gate of the other of said NMOS transistors, said first signal or said second signal, whichever is larger, is output from a common source electrode, and
   said small input selection circuit is a circuit comprising two NMOS transistors connected in series and, by applying said first signal to a gate of one of said NMOS transistors and said second signal to a gate of the other of said NMOS transistors, said first signal or said second signal, whichever is smaller, is output from a source electrode.

4. A computing circuit as claimed in claim 3, wherein the gate of the NMOS transistor to which said first signal is applied in said large input selection circuit and the gate of the NMOS transistor to which said first signal is applied in said small input selection circuit are a floating gate connected in common to both of said NMOS transistors, and
said computing circuit includes a write circuit for writing a voltage to said floating gate.

5. A computing circuit for computing an absolute difference between a first signal and a second signal, comprising:
   a large input selection circuit which compares said first and second signals and outputs whichever signal is larger in signal value;
   a small input selection circuit which compares said first and second signals and outputs whichever signal is smaller in signal value; and a subtraction circuit for subtracting the output of said small input selection circuit from the output of said large input selection circuit, wherein said large input selection circuit is a circuit comprising two PMOS transistors connected in series and, by applying said first signal to a gate of one of said PMOS transistors and said second signal to a gate of the other of said PMOS transistors, said first signal or said second signal, whichever is larger, is output from a source electrode, and said small input selection circuit is a circuit comprising two PMOS transistors connected in parallel and, by applying said first signal to a gate of one of said PMOS transistors and said second signal to a gage of the other of said PMOS transistors, said first signal or said second signal, whichever is smaller, is output from a common source electrode.

6. A computing circuit as claimed in claim 5, wherein the gate of the PMOS transistor to which said first signal is applied in said large input selection circuit and the gate of the PMOS transistor to which said first signal is applied in said small input selection circuit are a floating gate connected in common to both of said PMOS transistors, and said computing circuit includes a write circuit for writing a voltage to said floating gate.

7. A computing apparatus for computing the sum of absolute differences between corresponding signals in a first signal group and a second signal group each consisting of a predetermined number of signals, comprising:

computing circuits corresponding in number to said predetermined number of signals, each of said computing circuit comprising: a large input selection circuit which compares said first and second signals and outputs whichever signal is larger in signal value; a small input selection circuit which compares said first and second signals and outputs whichever signal is smaller in signal value; and a subtraction circuit for subtracting the output of said small input selection circuit from the output of said large input selection circuit, said subtraction circuit comprises: a capacitor; a first switch provided between a first terminal of said capacitor and the output of said large input selection circuit; a second switch provided between the first terminal of said capacitor and the output of said small input selection circuit; and a third switch provided between a second terminal of said capacitor and a terminal connected to a prescribed potential, and wherein: the absolute difference between said first signal and said second signal is output from said second terminal of said capacitor by first turning said first switch off and said third switch on, then turning said second switch on, and thereafter turning said third switch off, then turning said second switch off, and finally turning said first switch on, and wherein:

said second terminal of each capacitor is connected in common.

8. A computing apparatus as claimed in claim 7, wherein said second terminal connected in common is a floating gate, and wherein said floating gate is a gate of a source follower circuit, and said source follower circuit outputs the sum of the absolute differences between said first signal group and said second signal group.

9. A computing apparatus for computing the sum of absolute differences between corresponding signals in a first signal group and a second signal group each consisting of a predetermined number of signals, comprising:

selection circuits corresponding in number to said predetermined number of signals, each selection circuit including a large input selection circuit for comparing said first and second signals and for outputting whichever signal is larger in signal value, and a small input selection circuit for comparing said first and second signals and for outputting whichever signal is smaller in signal value;

a large summing circuit for summing the outputs of said large input selection circuits in said predetermined number of selection circuits;

a small summing circuit for summing the outputs of said small input selection circuits in said predetermined number of selection circuits; and a subtraction circuit for subtracting the output of said small summing circuit from the output of said large summing circuit.

10. A computing apparatus as claimed in claim 9, wherein said large summing circuit comprises: first capacitors corresponding in number to said predetermined number of selection circuits and having first terminals connected to the respective outputs of said large input selection circuits in said predetermined number of selection circuits and second terminals connected together as a common second terminal; a switch provided between said common second terminal and a terminal connected to a prescribed potential; and a first output circuit for outputting a potential level of said common second terminal, said small summing circuit comprises: second capacitors corresponding in number to said predetermined number of selection circuits and having first terminals connected to the respective outputs of said small input selection circuits in said predetermined number of selection circuits and second terminals connected together as a common second terminal; a switch provided between said common second terminal of said second capacitors and a terminal connected to a prescribed potential; and a second output circuit for outputting a potential level of said common second terminal of said second capacitors, and said subtraction circuit comprises:

a capacitor;

a first switch provided between a first terminal of said capacitor and the output of said first output circuit;

a second switch provided between the first terminal of said capacitor and the output of said second output circuit; and third switch provided between a second terminal of said capacitor and a terminal connected to a prescribed potential, and wherein:

the sum of the absolute differences between corresponding signals in said first signal group and said second signal group is output from said second terminal of said capacitor by first turning said first switch off and said third switch on, then turning said second switch on, and thereafter turning said third switch off, then turning said second switch off, and finally turning said first switch on.

11. A semiconductor computing circuit which compares a first signal and a second signal and outputs whichever signal is larger in signal value and whichever signal is smaller in signal value, comprising:

first and second NMOS transistors connected in parallel; and third and fourth NMOS transistors connected in series, and wherein:
  said first and said third NMOS transistor share a common floating gate, and
  by applying said second signal to the gates of said second and said fourth NMOS transistor after writing said first signal to said floating gate, said first signal or said second signal, whichever is larger, is output from a source electrode connected in common to said first and second NMOS transistors, while said first signal or said second signal, whichever is smaller, is output from a source electrode of said third and fourth NMOS transistors.

12. A semiconductor computing circuit which compares a first signal and a second signal and outputs whichever signal is larger in signal value and whichever signal is smaller in signal value, comprising:

first and second PMOS transistors connected in parallel; and third
and fourth PMOS transistors connected in series, and wherein:
  said first and said third PMOS transistor share a common floating gate, and
  by applying said second signal to the gates of said second and said fourth PMOS transistor after writing said first signal to said floating gate, said first signal or said second signal, whichever is smaller, is output from a source electrode connected in common to said first and second PMOS transistors, while said first signal or said second signal, whichever is larger, is output from a source electrode of said third and fourth PMOS transistors.

\* \* \* \* \*